United States Patent [19]
Lapierre et al.

[11] Patent Number: 6,163,230
[45] Date of Patent: Dec. 19, 2000

[54] PHASE-SHIFT KEYING ELECTRONIC CIRCUIT WITH DISTRIBUTED STRUCTURE

[75] Inventors: Luc Lapierre; Cyrille Boulanger; Christine Zanchi, all of Toulouse, France

[73] Assignee: Centre National d'Etudes Spatiales (C.N.E.S.), Paris Cedex, France

[21] Appl. No.: 09/367,696

[22] PCT Filed: Feb. 27, 1998

[86] PCT No.: PCT/FR98/00384

§ 371 Date: Aug. 19, 1999

§ 102(e) Date: Aug. 19, 1999

[87] PCT Pub. No.: WO98/38730

PCT Pub. Date: Sep. 3, 1998

[30] Foreign Application Priority Data

Feb. 28, 1997 [FR] France ................................. 97 02589

[51] Int. Cl.[7] .............................. H03C 3/00; H03C 7/02; H04L 27/20
[52] U.S. Cl. ........................ 332/103; 332/104; 332/105; 375/308
[58] Field of Search ................................. 332/103–105; 375/279–283, 308

[56] References Cited

U.S. PATENT DOCUMENTS 3,867,574  2/1975  McIntosh .
5,442,327  8/1995  Longbrake et al. .
5,463,355  10/1995  Halloran .
5,504,461  4/1996  Vaughn et al. ........................ 332/103

OTHER PUBLICATIONS

By A. Boveda et al., "A 0.7–3 GHz GaAs QPSK/QAM Direct Modulator", *IEEE Journal of Solid–State Circuits*, vol. 28, No. 12, Dec. 1993, pp. 1340–1349.

By A. Primerose et al., "High Bit Rate Four Phase MMIC Remodulation Demodulator and Modulator", Proceedings of the GAAS92 European Gallium Arsenide and Related III–V Compounds Applications Symposium, Apr. 1992, 6 pages.

By C.L. Liu, "π/4–QSPK Modems for Satellite Sound/Data Broadcast Systems", IEEE Transactions on Broadcasting, vol. 37, No. 1, Mar. 1991, pp. 1–8.

By L.M. Devlin et al., "A Versatile Vector Modulator Design for MMIC", *IEEE MTT–S Digest L–7*, 1990, pp. 519–522.

*Primary Examiner*—David Mis
*Attorney, Agent, or Firm*—Young & Thompson

[57] ABSTRACT

The invention concerns a modulating electronic circuit with m phase status $m \geq 2$ comprising a distribution line (6) with n similar dephasing cells (Ci) $n \geq 2$, each comprising a transistor supplying on a derivative output (ODi) an out-of-phase signal (SDi); a secondary switching/modulating stage (4) controlled on the basis of a control signal; means for summing in phase the signals derived the switching/modulating stage (4).

17 Claims, 5 Drawing Sheets

PHASE-SHIFT KEYING ELECTRONIC CIRCUIT WITH DISTRIBUTED STRUCTURE

The invention concerns a phase-shift keying modulator circuit (so-called PSK "phase Shift keying" or MDP "modulation de phase").

Such circuits are used in particular for the transmission of digital signals. For example, the transmission of digital signals between a satellite and earth can be effected by phase modulation of a microwave carrier signal by a digital signal.

Binary phase-shift keying (BPSK/or MDP2) or quadrature phase-shift keying (QPSK/or MDP4) modulator circuits are already known ("HIGH BIT RATE FOUR PHASE MMIC REMODULATION DEMODULATOR AND MODULATOR", A. Primerose et al., Proceedings of GAAS '92, Estec, Nordwich, The Netherlands). A BPSK circuit can thus be formed by a low-pass filter and a high-pass filter mounted in parallel and whose outputs are switched to a common output by an array of two shunted MESFET transistors whose gates receive complementary, two-state signals. This circuit has the advantage of supplying a phase shift between the signals, which of course by design tends towards the theoretical value of 180°, despite inevitable manufacturing imperfections. Furthermore, the MESFET transistors used for switching are not biased and the circuit introduces only small losses (of the order of 3 dB). It can be realised in MMIC technology and requires little space (typically 2 mm×1 mm for 8 GHz). Nevertheless, such a BPSK circuit has the drawback of a large spectral bandwidth for a given bit timing. Moreover, it does not include any electrical control means and does not allow phase shifts with values other than 180°, so that it cannot be used in certain applications when a residual carrier with non-zero amplitude is required(to synchronize a receiver for example).

A QPSK circuit formed from two BPSK circuits allows a smaller spectral bandwidth for the same bit timing, but still has the disadvantages of absence of adjustment means based on an electrical control and only allows phase shifts of a fixed value. Furthermore, these circuits generate larger losses (of the order of 8 dB) and have overall dimensions of the order of 2.5 mm×3.5 mm at 8 GHz.

πn/4-QPSK circuits are also known ("π/4-QPSK MODEMS FOR SATELLITE SOUND/DATA BROADCAST SYSTEMS", Chiu-Liang Liu, Kassilo Feher, IEEE Transactions on broadcasting, vol. 37, No. 1, March 1991, pp 1–8) which are circuits with eight phase states obtained by additional π/4 phase shifts at each phase change. These circuits have the same disadvantages as the abovementioned traditional QPSK circuits. It should also be noted that of the eight possible phase states, only certain phase transitions are allowed, so that the π/4-QPSK circuits are only compatible with an appropriate coding system, and in particular cannot be used with certain types of digital signal coding to be transmitted.

The document "A VERSATILE VECTOR MODULATOR DESIGN FOR MMIC", L. M. Devlin, B. J. Minnis, 1990 IEEE MTT-S Digest L-7 pp 519–522, describes a 2×four phase state modulator circuit, that is to say producing two vectorial signal structures with different amplitudes. This circuit has overall dimensions of 4 mm×3 mm at 8 GHz, and has four variable resistances whose adjustment is complex. Moreover, it is functionally equivalent to a QPSK circuit, since the eight phase states, not having the same amplitude, are not useable for basic phase modulation (without amplitude modulation) with eight phase states.

With the aim of reducing the power during the transmission, an attempt is made to use high-performance digital signal coding such as TCM (trellis-coded modulation). To do this, it is essential to have modulation circuits having a number of phase states greater than four (in particular 8, 16 . . . ).

Now it is not conceivable to combine the architecture of the known BPSK or QPSK arrangements in the same circuit with the aim of improving bit rate performance since the imperfections of each component affect the others and accumulate at the output. Moreover, a crippling loss of power results, particularly for systems on board aircraft and spacecraft. Furthermore, the very costly manufacturing refinements would be multiplied.

The invention therefore aims to overcome these drawbacks by proposing a PSK modulator circuit whose structure enables phase states of any value to be obtained, with a zero or low power loss and with a low energy consumption, so that this circuit can be adapted and used with numerous types of coding and phase modulation and in numerous applications.

The invention furthermore aims to propose a modulator circuit whose number of phase states can be greater than four (with the same amplitude and the same frequency), in particular equal to eight, sixteen . . . .

The invention furthermore aims to propose such a PSK modulator circuit which is advantageously suited to construction using microwave monolithic technology (MMIC)—particularly on gallium arsenide (GaAs)—with excellent precision.

More specifically, the invention aims to propose a PSK modulator circuit having simple means for setting the phase states, in particular in accordance with the frequency of the input signal, so as to permit its characteristics to be adjusted in relation to the system in which it is incorporated, and this at the same time as its incorporation in the system (and not at the time of its design or of the manufacture of the PSK integrated circuit itself).

The invention furthermore aims more specifically to propose such a PSK modulator circuit that is compatible with the constraints of on-board space systems (compact dimensions, excellent reliability, low consumption . . . ).

The invention also aims more specifically to propose such a PSK modulator circuit that is compatible with high bit rate modulation coding systems such as TCM.

The invention also aims more specifically to propose such a PSK modulator circuit that is able to be adapted to any carrier signal frequency, in particular in the microwave region.

The invention also aims more specifically to propose such a PSK modulator circuit that, once produced, can accept incoming carrier signals whose frequency is fixed, but can also be selected within a wide band (for example in the X band or the Ka band for earth observation telmetering, in the K band of multimedia telecommunication satellites . . . ).

The invention furthermore aims to propose such a PSK modulator circuit that does not produce any appreciable interference to the line or the input signal.

To achieve this, the invention concerns an electronic phase-shift keying modulator circuit comprising an input intended to receive a sinusoidal input signal Se of angular frequency we and an output delivering a sinusoidal output signal Ss phase shifted with respect to the input signal by a value φj which can vary among m values, φ1, . . . , φj, . . . , φm, m being an integer greater than or equal to 2, in accordance with a control signal SCj, the output signal Ss having an angular frequency ωs that is independent of the control signal Scj, wherein said circuit comprises:

a distribution line extending from the input and including n cells Co, ..., Ci, ..., Cn−1, of similar phase shift, n being a whole number greater than or equal to 2, the n phase-shift cells being mounted along the distribution line with each phase-shift cell Ci of rank i along the distribution line comprising:

an input, referred to as the series input ISi, receiving the signal coming from the input of the circuit, either directly where i=0, or via (i−1) preceding phase-shift cells of rank less than i, interposed between the input of the circuit and this phase-shift cell Ci, a first output, referred to as the series output OSi, delivering the signal on the distribution line to a subsequent phase-shift cell Ci+1 of higher rank i+1, or, where i=n−1, to a terminating device of the distribution line, a tapping point Ni of the distribution line, a second output, referred to as the branched output ODi, connected to the tapping point Ni via a transistor Ti whose first terminal is connected to the tapping point Ni, whose second terminal is connected to ground, and whose third terminal supplies said branched output ODi of the phase-shift cell Ci, each phase-shift cell Ci being designed to deliver at its branched output ODi a signal SDi that is phase shifted with respect to the input signal Se, by the sum φ(Ci) of the phase shifts successively applied to the input signal Se, from the input of the circuit by the phase-shift cells interposed between the input of the circuit and said branched output ODi, connected to said branched output ODi of each phase-shift cell Ci, a switching/modulating circuit controlled by the control signal SCj, this switching/modulating circuit being:

when n=m, a switching circuit delivering either a zero signal, or the signal SDi received from the cell Ci, in accordance with the control signal SCj, when n≠m, a modulating circuit with p phase states, p being a whole number less than m chosen so that $m \leq p^n$, designed to phase-shift the signal SDi received from the phase-shift cell Ci by a value φk, k being a whole number varying between 1 and p, in accordance with the control signal SCj, means for summing in phase the signals Ssi coming from n switching/modulating circuits and to deliver at said output of the circuit the result of this sum which forms the output signal Ss.

A circuit according to the invention thus has a distributed type of structure. This structure provides a great number of adaptation options. In particular, the number n of phase-shift cells can be optimized in relation to the number m of desired phase states. The phase shift applied to the signal by each phase-shift cell and, if need be, by each modulator circuit with p phase states, can also be optimized.

Throughout this patent application, the expression "similar phase-shift cells" signifies that the cells are composed of electronic components having the same electronic functions, even if the structure and the values of these components differ from cell to cell. Moreover, the expression "functionally identical phase-shift cells" denotes phase-shift cells which are similar and which are designed to normally induce exactly the same phase shift in the signal between their input and their outputs.

It should be noted that the modulator circuits with p phase states used at the output of the phase-shift cells can themselves have a distributed structure according to the invention. In that way the invention enables the production of "multi-stage" modulator circuits comprising several cascaded PSK phase-shift stages.

In practice, it can be seen that this distributed structure effectively allows adequate precision to be obtained for each phase state in order to realise a circuit—in particular by the use of MMIC technology—with eight phase states, or indeed even more.

Advantageously and according to the invention, the circuit comprises means for biasing the transistors of the phase-shift cells. Each PSK phase-shift stage is therefore amplified by these transistors, which provide gain to the signal.

Furthermore, advantageously and according to the invention, each of said transistors is a field-effect transistor—in particular MESFET (on GaAs)—whose:

first terminal is the gate, second terminal is the source, third terminal is the drain.

The field-effect transistors have an input conductance whose real part is very low, which puts little load on the distribution line, and thus allows a virtually identical level to be obtained at each of the tapping points and at each branched output. All the downstream switching/modulating circuits are therefore supplied with the same signal level.

Moreover, the switching/modulating circuits of each branch are isolated from each other by the field-effect transistors and do not mutually interfere (for example, if each switching/modulator circuit is a BPSK type, the SWRs (standing wave ratios) of the BPSK circuits at the change-of-state rate run no risk of degrading the accuracy of the states.

Equally, the field-effect transistors isolate the line and the input signal, which is not disturbed by the switching operations induced by the circuit.

Furthermore, a circuit according to the invention comprises means for applying a DC voltage whose value is adjustable at the tapping point Ni, so as to form an adjustable capacitance between the tapping point Ni and ground. In fact, the field-effect transistors have a non-linear input capacitance that can be adjusted by the gate bias voltage. This variable capacitance, in parallel with the distribution line, enables the phase-shift generated by each cell to be adjusted. That allows the accuracy of the phase states to be improved and the risks of poor operation associated with the circuit production process to be minimized.

Advantageously, a circuit according to the invention has the feature wherein each phase-shift cell Ci is of a series inductance and parallel capacitance type, wherein said transistor of each phase-shift cell Ci is a biased field-effect transistor whose gate is connected to the tapping point Ni on the distribution line in parallel with the inductance, whose source is connected to ground, and whose drain supplies the branched signal SDi to said branched output, and wherein said parallel capacitance is at least partially made up of the capacitance formed between the gate and the source of said biased field-effect transistor.

Furthermore, advantageously and according to the invention, all the phase-shift cells are functionally identical and generate the same phase shift Δφ along the distribution line, the cell Ci delivering at its branched output a branched signal SDi that is phase-shifted with respect to the input signal Se by φ(Ci)=i×Δφ+ψ, where ψ is a constant. This phase-shift Δφ, identical for all the cells, can be equal to 2π/m, or different from 2π/m (if an output signal with a mean value other than zero is required).

Furthermore, advantageously and according to the invention, the means for applying and adjusting a DC voltage whose value is adjustable at each tapping point Ni include a terminal of the distribution line intended to receive a DC voltage so that the phase shifts of the signal at each tapping point Ni of the phase-shift cells Ci can be adjusted simultaneously, in particular in accordance with the angular frequency ωe, by setting this one variable DC voltage. It should be noted that MMIC technology is particularly well adapted to this simultaneous adjustment of all the LC phase-shift cells, since the transistors of the same chip have very little leakage, so that the input capacitances of the transistors are equal and vary in the same way with the bias.

Advantageously and according to the invention, said means for summing in phase comprise, particularly when n=m, star-connection lines from the outputs of n switching/modulating circuits to a common output point and all these branching lines have the same length, so as to present a constant output impedance, generally 50 Ohms.

Furthermore, advantageously and according to the invention, and particularly when n≠m, said means for summing in phase include a phase combiner circuit formed by a Wilkinson coupler tree, the final apex of which forms said output of the circuit. The advantage of Wilkinson couplers is to isolate said p state phase modulator circuits from each other at the output end. These circuits are thus isolated from the input end by the transistors of the phase-shift cells and at the output end by the Wilkinson couplers.

Advantageously and according to the invention, when m is a multiple of a power of 2, n is made equal to a power of 2. In this way, the Wilkinson coupler tree has an axial symmetry with respect to the output of the circuit (since each Wilkinson coupler has two inputs and one output).

Advantageously, a circuit according to the invention has the feature wherein m is greater than or equal to 4, p is equal to 1, 2 or 4.

Advantageously, a circuit according to the invention has the feature wherein m is greater than or equal to 8, n is greater than or equal to 4.

More generally, n is advantageously greater than or equal to m/2. The number of phase states of the modulator circuits at the output of the phase-shift cells can thus be minimized (in particular equal to 2).

Moreover, advantageously and according to the invention, the switching/modulating circuits are similar and consist exclusively of passive components. Throughout this patent application "passive components" are all components mounted so as not to require any additional electrical power supply for their operation (resistors, inductors, capacitors, non-biased transistors . . . ).

Advantageously, and particularly when m is a multiple of 2, a circuit according to the invention has the feature wherein p=2 and wherein the switching/modulating circuits are binary phase-shift keying BPSK circuits with passive components, each formed by a high-pass filter and a low-pass filter mounted in parallel and whose outputs are switched by a non-biased field-effect transistor array with their gate receiving a control signal having two complementary states. The p phase state phase modulator circuits are thus traditional BPSK circuits (p=2).

Moreover, advantageously, a circuit according to the invention comprises means forming a variable impedance at one end terminal of the distribution line opposite to the input of the circuit, to allow its impedance matching.

Advantageously and according to the invention, the variable impedance comprises a field-effect transistor configured as a variable resistance, and whose gate receives a DC control voltage.

Advantageously and according to the invention, a circuit according to the invention has a feature wherein the frequency of the input signal is greater than 1 Gigahertz and said circuit is formed from a monolithic integrated circuit.

The invention also extends to a circuit wherein it includes in combination all or some of the characteristics mentioned above or below.

Other aims, features and advantages of the invention will be revealed in the following description of non-restricting exemplary embodiments of the invention, and which refers to the accompanying figures, in which.

Figure 1:
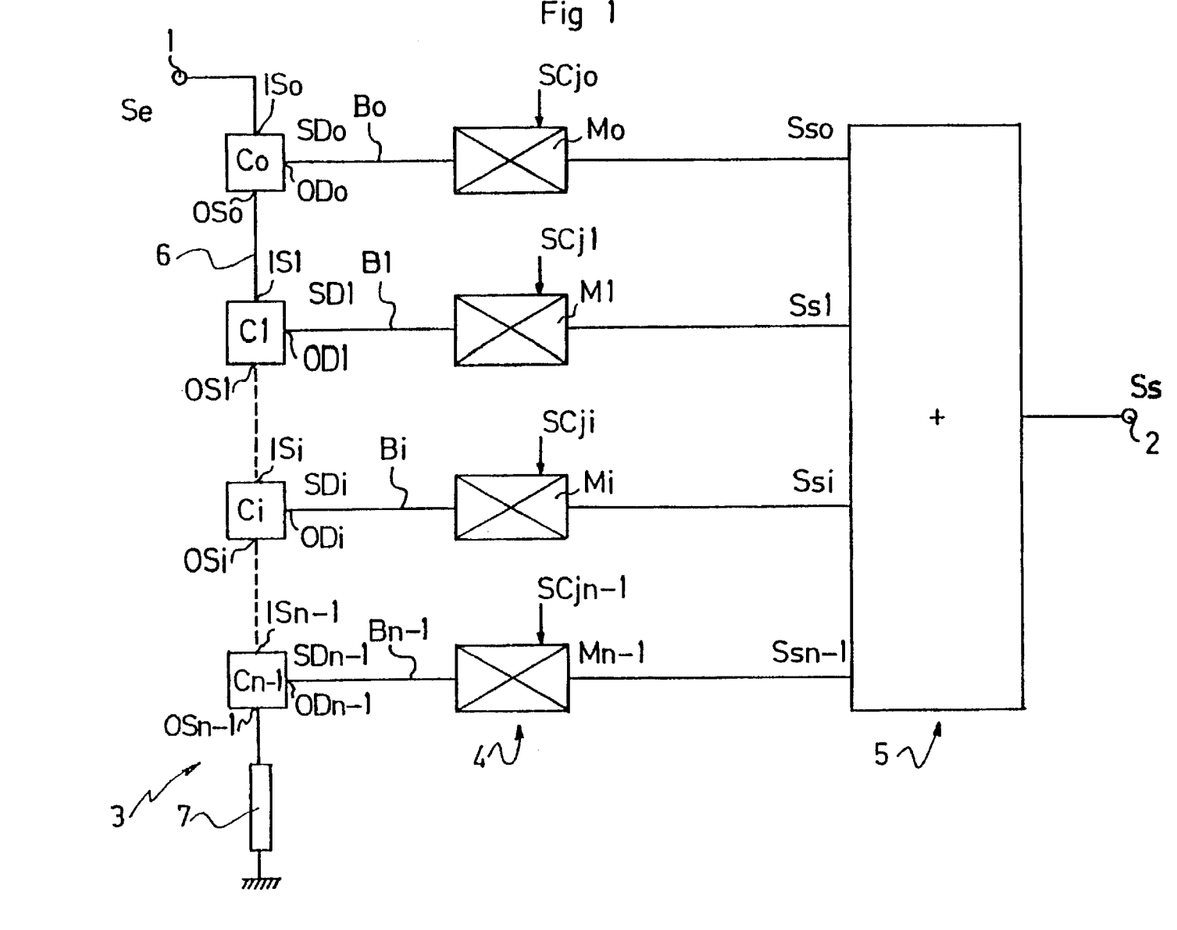
FIG. 1 is a schematic view of the entire circuit according to the invention.

A circuit according to the invention shown in a general way in FIG. 1 comprises an input 1 intended to receive, in the form of an electric current, an input signal $Se=A\sin(\omega e t + \phi e)$ and an output 2 intended to deliver, in the form of an electric current, an output signal $Ss=A'\sin(\omega s t + \phi s)$ phase modulated according to a control signal SCj that is generally a digital signal or represents a digital signal.

The circuit according to the invention is a phase-shift keying (PSK/ or MDP) modulator circuit with m phase states, that is to say the output signal Ss is phase-shifted with respect to the input signal by a value $\phi j = \phi s - \phi e$, which may vary among m values $\phi 1, \phi 2, \ldots, \phi j, \ldots, \phi m$, m being a whole number greater than or equal to 2.

By contrast, the bit timing ωs of the output signal is independent of the control signal SCj, and is generally identical to ωe. The circuit according to the invention is particularly suited to the processing of signals in the microwave range (conventionally from 1 GHz to 300 GHz) where propagation phenomena are significant. Nevertheless, the invention is also applicable to the production of phase modulator circuits in all frequency ranges.

In the embodiments shown, by preference and according to the invention, the amplitude A' of the output signal can vary in relation to the control signal SCj, but it is not generally used as a modulation parameter. Nevertheless, the circuit according to the invention is also compatible with amplitude modulation combined with phase modulation, either with the aid of a modulation coding system which uses the different amplitude states that can be obtained with the circuit according to the invention in certain configurations, or by use of supplementary means for amplitude modulation arranged upstream and/or downstream of the circuit according to the invention.

From the upstream end to the downstream end (that is to say from the input 1 up to the output 2) the circuit according to the invention basically comprises three successive stages, i.e.: a primary distribution/modulation stage 3 comprising a distribution line 6, at least one secondary switching/modulating stage 4, and a multiplexing stage 5 at the output 2.

The distribution line 6 enables the signal to be distributed to a number of n branches B0, B2, . . . , Bi, . . . , Bn−1, by applying a primary phase shift φ(Ci) depending on the rank i of the branch Bi. The distribution line 6 thus comprises n cells C0, C1, . . . , Ci, . . . , Cn−1 of similar phase shift, mounted end to end in a ladder configuration to define the n branches. The number n is a whole number greater than or equal to 2 (the distribution line 6 contains at least two phase-shift cells in order to distribute the signal to at least two branches) and is preferably less than or equal to m.

Each phase-shift cell Ci of rank i of the distribution line 6 comprises:
- an input, referred to as the series input ISi, receiving the signal coming from the input 1 of the circuit, either directly where i=0, or where i≠0 via (i−1) preceding phase-shift cells of lesser rank, interposed between the input 1 of the circuit and this phase-shift cell Ci,
- a first output, referred to as the series output OSi, connected, where i≠n−1, to the series input ISi+1 of a subsequent phase-shift cell Ci+1 of higher rank i+1 or, where i=n−1, to a terminating device 7 of the distribution line 6, said series output OSi delivering a signal, referred to as the series signal SSi,
- a second output, referred to as the branched output ODi, connected to one of the branches Bi corresponding to said phase-shift cell Ci, said branched output ODi delivering a signal referred to as the branched signal SDi.

Each phase-shift cell Ci is designed to apply a phase shift, referred to as the series phase shift φSi between the signal that it receives at its series input ISi (which is the series signal SSi−1 delivered by the cell Ci−1 immediately upstream on the line) and the signal SSi which it delivers to its series output OSi, and to apply a phase shift, referred to as the branched phase shift φDi, between the signal that it receives at its series input ISi and the signal SDi which it delivers to its branched output ODi.

The phase shift of the series signal SSi with respect to the input signal Se is equal to $$\sum_{t=0}^{i} \phi St$$

The phase shift φ(Ci) presented by the branched signal SDi applied to the branch Bi by the cell Ci with respect to the input signal Se is written:

$$\phi(Ci) = \phi Di + \sum_{t=0}^{i-1} \phi St$$

Each phase-shift cell Ci is advantageously formed by a low-pass LC filter with series inductance and parallel capacitance, and includes a tapping point Ni at which the signal, with respect to the series input signal ISi, presents a phase shift that depends on the value of the series inductance interposed between the series input ISi and the tapping point Ni and on the total parallel capacitance formed between the tapping point Ni and ground.

The phase-shift cells Ci form, between the input 1 and the terminating device 7, a distribution line configuration 6, which can be considered as an L or T or π configuration, according to the branches (with or without series inductance) of the first tapping point No with respect to the input 1 and of the last tapping point Nn−1 with respect to the terminating device 7 of the distribution line 6.

Figure 2:
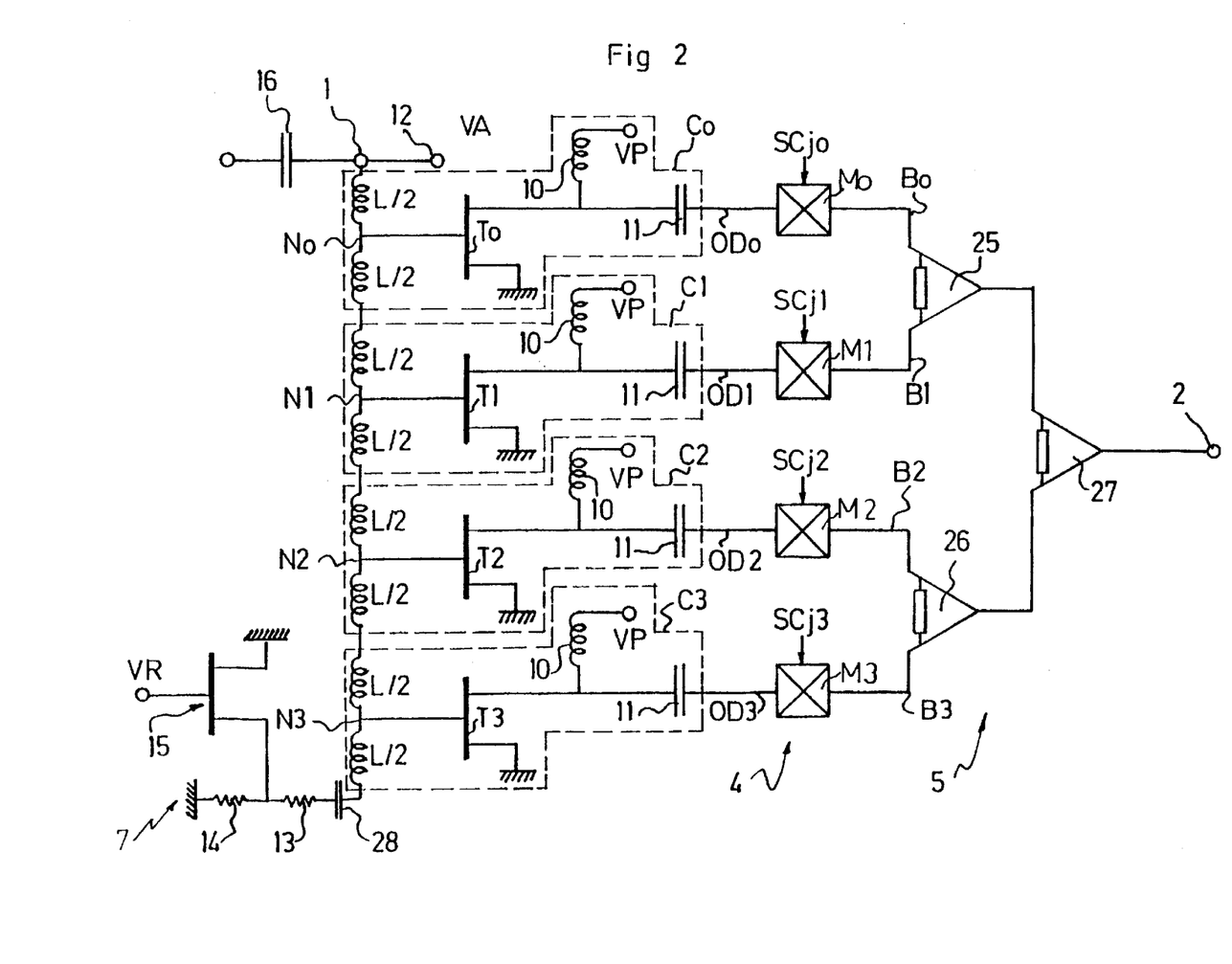
FIG. 2 is a schematic view of an embodiment of a circuit according to the invention, where m=8, n=4, p=2.
Figure 5:
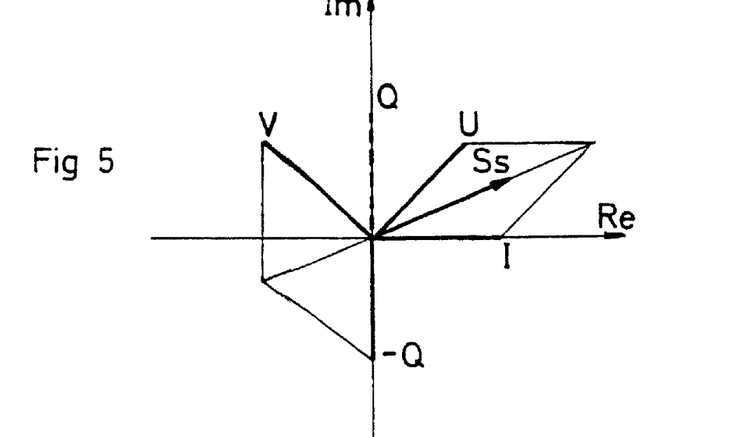

FIG. 2 represents a configuration that can be considered as a T configuration. The tapping point Ni is connected to the branched output ODi of the cell Ci via a field-effect transistor To, . . . , Ti, . . . , Tn−1, whose gate is directly connected to the tapping point Ni, whose source is directly connected to ground and whose drain is connected to the branched output ODi. Each transistor Ti is biased so that said parallel capacitance of the phase-shift cell Ci is at least partially made up of the capacitance formed between the gate and the source of the transistor Ti. In the embodiment of FIG. 2, the parallel capacitance of each phase-shift cell Ci is formed exclusively by the transistor Ti. In the embodiment of FIG. 5 an additional capacitor 8, 9 is interposed between each tapping point and ground.

Each phase-shift cell Ci contains means 10, 11 for biasing its transistor Ti, for example in the form of a surge inductance 10 one of whose terminals is connected to the drain of the transistor Ti and whose other terminal receives a fixed DC bias voltage VP, and a blocking capacitor 11 connected in series between the drain and the branched output ODi.

With such an arrangement, the value of the capacitance formed between the gate and the source is non-linear and depends on the DC gate bias voltage. The circuit according to the invention therefore includes means 12 for applying a DC voltage of adjustable value, after production of the circuit, to each tapping point Ni. These means 12 can simply consist of a terminal 12 of the distribution line 6 designed to be able to receive an adjustable DC voltage VA formed by voltage generation means external to the circuit. An isolating capacitor 16 is provided upstream of the input 1 to isolate the source generating the input signal (generally an oscillator) from the DC voltage VA.

It should be noted that, as a variant or in combination, bias voltages VP can be used to adjust the value of the phase shifts created by the phase-shift cells Ci.

In the embodiment of FIG. 2, advantageously and according to the invention, the distribution line 6 contains a number of inductances arranged in series from the input 1 of the circuit to the terminating device 7, separated from each other by the tapping points No, . . . , Ni, . . . , Nn−1, to which the gates of the transistors Ti are connected. The inductance L between two tapping points is shown split into two parts L/2 to show that each part of this inductance forms a respective functional part of each corresponding phase-shift cell (shown by the broken lines) and the T configuration thus obtained.

Advantageously and according to the invention, all the phase-shift cells Co to Cn−1 are functionally identical and generate the same series phase-shift φSi and the same phase-shift φDi from their series input ISi along the distribution line 6.

Thus, for all the ranks i between 1 and n−1, the phase difference φ(Ci)−φ(Ci−1)=Δφ between the branched signals SDi and SDi−1 delivered by the cells Ci and Ci−1 which adjoin each other along the distribution line, is the same along the distribution line 6.

Advantageously and according to the invention, Δφ=2π/m. In other words, φ(Ci)=i×Δφ+ψ=2πi/m+ψ, where ψ is a constant. In that way, the signal Ss at the output of the circuit will have a mean amplitude (with respect to time) of zero (the circuit supplying modulation without a residual carrier).

When the circuit is being designed, with an appropriate choice of the value of L and of the transistors, it is easy to obtain suitable values for the primary phase-shifts applied to the input signal by the phase-shift cells Ci. Furthermore, these phase-shifts can be adjusted simultaneously after production of the circuit by applying a suitable voltage VA which enables the gate-source capacitance of the transistors to be varied.

It should be noted that this structure is particularly suited to production using monolithic technology—especially MMIC—all the transistors being identical, having low leakage and equal capacitances varying in the same way with VA.

The terminating device 7 contains an isolating capacitor 28, two series resistors 13, 14 and a field-effect transistor 15 configured as a variable resistance, whose drain is star-connected between the two series resistors 13, 14, whose source is grounded and whose gate receives a DC control voltage VR. A variable resistance is thus formed that is able to be adjusted by the electrical parameter VR, which easily allows the impedance of the distribution line 6 to be matched, in particular to take account of variations in the voltage VA and in the parallel capacitances formed by the transistors Ti of the phase-shift cells Ci, and technological variations in the resistors 13, 14 during production.

It should be noted that the distribution line 6, and particularly the phase-shift cells Ci, can be realised differently from a ladder configuration of LC circuits (for example delay lines, bridged T arrangements . . . ), since each phase-shift cell Ci delivers a branched signal SDi phase-shifted by a value $\phi(Ci)$ which is appropriate to it with respect to the input signal Se.

In accordance with the control signal SCj, the secondary switching/modulating stage 4 enables branched output signals Ssi to be formed from n branched signals SDi delivered by the phase-shift cells Ci at their branched output ODi.

This secondary switching/modulation stage 4 thus comprises a switching/modulating circuit Mi connected to the branched output ODi of each phase-shift cell Ci at each branch Bi, that is to say a total of n switching/modulating circuits M0, . . . , Mi, . . . , Mn−1.

The stage 4 can be composed, particularly if n=m, of simple in-phase switching circuits delivering at the output a signal SSi that is either each branched signal SDi or a zero signal, depending on the state or the value of the control signal SCj.

In particular if n≠m, the stage 4 consists of phase modulator circuits Mi with p phase states, p being a whole number chosen so that m≦pn and p<m. Therefore these circuits are themselves of the PSK type, but having a much smaller number of phase states p than the circuit according to the invention. Each phase modulator circuit Mi is designed to phase-shift the branched signal SDi which it receives a value $\phi k$, k being a whole number varying between 1 and p in accordance with the control signal SCj.

In practice and in general, it is desirable to minimize p to simplify the construction and obtain reliable circuits and low consumption and losses. Advantageously, (preferably if m is a multiple of 2, which is the most common case) p=2 and the modulator circuits Mi are BPSK types.

Figure 3:
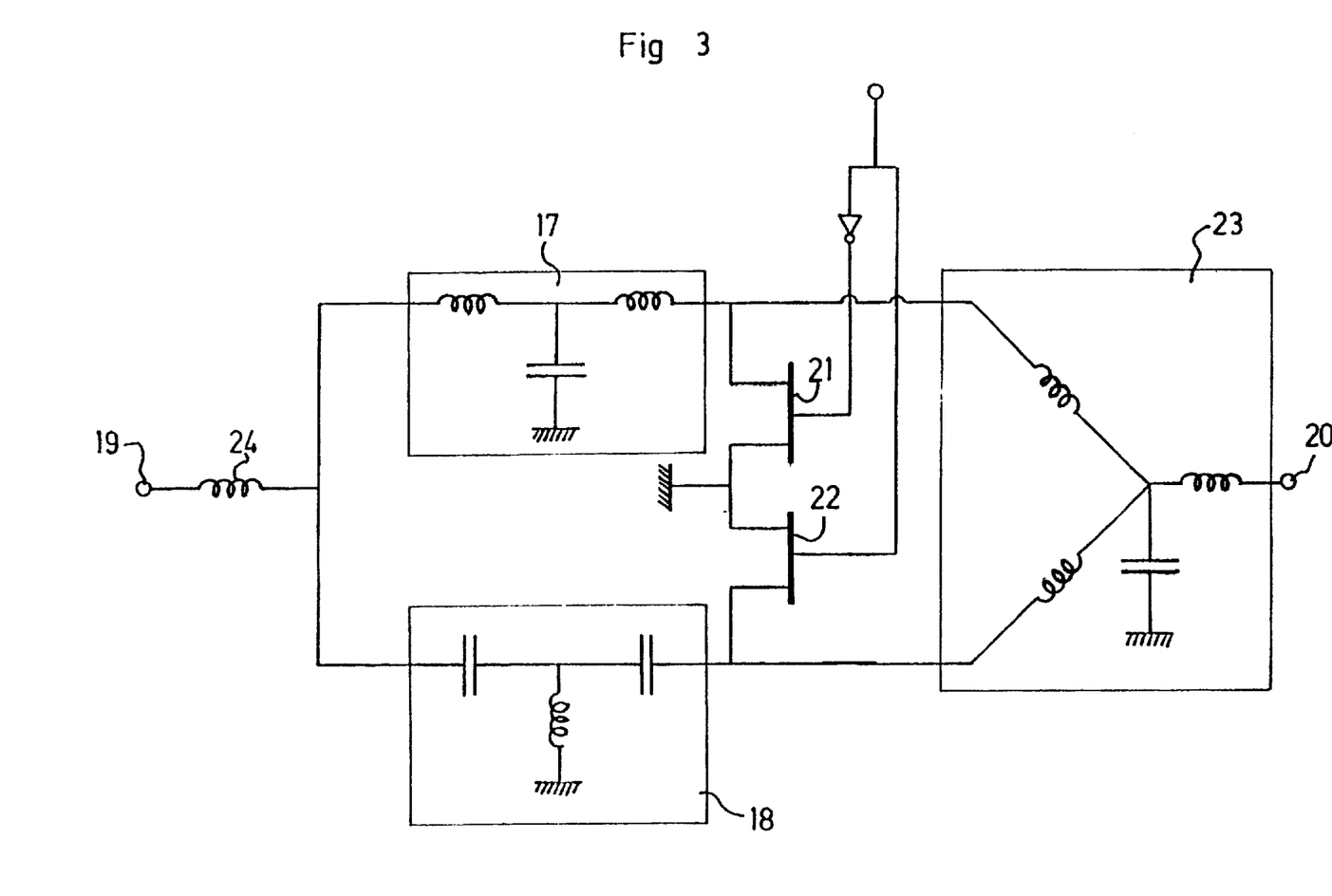
FIG. 3 is a schematic view of an embodiment of the binary phase-shift keying BPSK modulator circuit of FIG. 2, FIGS. 4 and 5 are Fresnel diagrams showing two examples of the vectorial construction in the complex plane of the output signal of the circuit of FIG. 2.

Such is the case with the embodiment of FIG. 2, where n=4 and p=2, the modulator circuits M0, M1, M2, M3 being BPSK types produced in the conventional manner in accordance with the diagram shown in FIG. 3. Each circuit M0 to M3 is formed by a T type low-pass LC filter 17 and a T type high-pass LC filter 18 connected in parallel downstream of an input terminal 19, and whose outputs are switched and combined in phase at a common output terminal 20 by a parallel configuration of two unbiased switching field-effect transistors 21, 22, having one terminal connected to the output of the corresponding filter 17, 18, one terminal connected to ground, and receiving via their gate a control signal with two complementary states so that only one of the two transistors 21, 22 is conducting at the time and the transistor 21, 22 conducting for the first state of the control signal is turned off for the second state. The signals emerging from the filters and switched in this way are combined in phase by the combiner 23, with star-connected inductances and matching parallel capacitance, at the output terminal 20. A series matching inductance 24 is provided between the input terminal 19 and the filters 17, 18. Such a BPSK circuit is itself known and has the particular advantage of a phase shift which tends naturally to 180°, and of being able to be constructed on an integrated circuit of the MMIC type.

As a variant, a BPSK circuit which itself conforms to this invention (for example according to a diagram similar to that shown in FIG. 5) can certainly be employed in the circuit of FIG. 2.

The control signal SCj contains n components of p states and therefore represents a digital signal able to assume $p^n$ values. Nevertheless, the signals Ssi coming from n switching/modulating circuits Mi are combined in phase at the output 2 with the aid of the multiplexing stage 5. Consequently, the output signal Ss sometimes only represents a number $m<p^n$ phase states (for certain values of n, of p and of $\phi(Ci)$ the signals may cancel each other and/or the phase states may be repeated).

A control signal SCji is applied to each switching/modulating circuit Mi, and this signal SCji is one of the components SCji of the control signal SCj.

Each of the modulator circuits Mi delivers a branched output signal Ssi, the phase of which is therefore $\phi i=\phi(Ci)+\phi k$.

$\phi k$ varies with the control signal SCj, and more specifically with the component SCji of the control signal, which is applied to the modulator circuit Mi. Preferably, all the modulator circuits Mi are identical and designed so that $\phi k=2\pi k/p$.

In the embodiment of FIG. 2, the control signal SCji is made up of four components SCj0, SCj1, SCj2, SCj3, which are the voltages representing logic levels, each being able to assume two complementary values U0, $\overline{U0}$; U1, $\overline{U1}$, U2, $\overline{U2}$; U3, $\overline{U3}$.

The branched output signals Ss0, Ss1, Ss2, Ss3 can be represented in the complex plane by vectors I, U, Q, V, and each can assume two phase-shifted values of 180°, corresponding to the vectors I, -I; U, -U; Q, -Q; V, -V, respectively.

The multiplexing stage 5 is composed of means for summing in phase (vectorial sum) the signals SSi and for delivering at the output 2 of the circuit the result of this vectorial sum, which forms the output signal Ss. These means comprise an in-phase combiner circuit formed by a Wilkinson coupler tree (in-phase power couplers), the final apex of which forms said output 2 of the circuit.

In the case of FIG. 2 where n=4, the multiplexing stage 5 includes three Wilkinson couplers 25, 26, 27, that is to say two couplers 25, 26 of a first series coupling the signals SSi in pairs and a second series coupler 27 receiving the signals emerging from the first series couplers 25, 26 and delivering the output signal Ss at the output 2.

Figure 4:
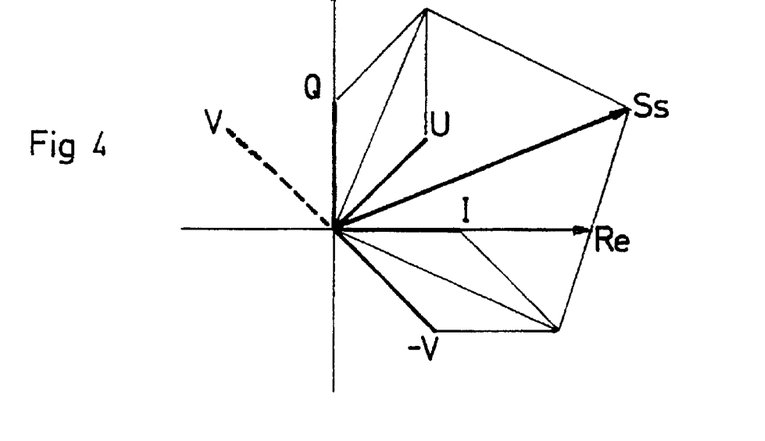

If the inductances L and the field-effect transistors T0, T1, T2, T3 and VA are chosen so that $\Delta\phi=\pi/4$, the output signal Ss is represented in the complex plane by a vector Ss which describes a double signal structure of 8 phase states. The first signal structure corresponds to signals Ss with amplitudes greater than those of the second signal structure. FIG. 4 shows an example of the construction of an output signal Ss corresponding to the first signal structure, obtained when all the branched output signals Ssi are phase-shifted in pairs by π/4, that is to say when the control signal SCj assumes the following values:

|     | SCj0 | SCj1 | SCj2 | SCj3 |
|-----|------|------|------|------|
| SC1 | I    | U    | Q    | -V   |
| SC2 | I    | U    | Q    | V    |
| SC3 | -I   | U    | Q    | V    |
| SC4 | -I   | -U   | Q    | V    |
| SC5 | -I   | -U   | -Q   | V    |
| SC6 | -I   | -U   | -Q   | -V   |
| SC7 | I    | -U   | -Q   | -V   |
| SC8 | I    | U    | -Q   | -V   |

In theory, with this first structure, A'/A 32 2.613.

The second signal structure, of which an example of the construction of the signal Ss is represented in FIG. 5, corresponds to the case where at least one pair of branched output signals which adjoin each other in the complex plane, are phase-shifted by π/2. It corresponds to the other eight possible values of the 16 values ($2^4=p^n$) of the control signal SCj.

In theory, with this second signal structure, A'/A=1.082.

Consequently, although the circuit in fact delivers sixteen output signal states, these sixteen states correspond to only eight phase states (and two amplitude states in a ratio of 7.66 dB).

The circuit of FIG. 2 can be used for the transmission of digital signals by a microwave carrier signal (input signal Se) (a frequency between 1 GHz and 300 GHz) phase modulated according to TCM coding. In this case, preferably only the first signal structure is used at maximum amplitude, so as to minimize the modulator losses. In this respect it should be noted that the transistors T0, T1, T2, T3 of the phase-shift cells C0, C1, C2, C3 of the branches B0, B1, B2, B3 are biased and reduce the losses, indeed even provide a gain between the input 1 and the output 2.

In order to select the first signal structure it is sufficient to provide a transcoder circuit between the 3-bit coded digital signal (8 states) and the 4-bit coded signal SCj, of which only 8 combinations are applied to the modulators Mi.

The circuit of FIG. 2 can be realised using MMIC technology and, for a frequency of 8 GHz, has dimensions of the order of 4.3 mm×4.1 mm, supplying eight true phase states, indeed even sixteen phase states if Δφ≠π/4 is chosen (for example where Δφ=π/8).

Figure 6:
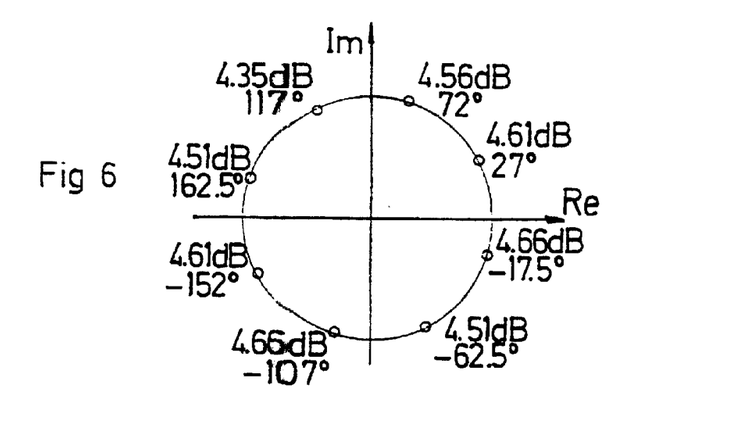
FIG. 6 is a Fresnel diagram showing in the complex plane an 8 phase state configuration of the output signal that can be obtained with the circuit of FIG. 2.

FIG. 6 represents an example of a signal structure that can be obtained with the circuit of FIG. 2, where ωe/2π=8 GHz. In this diagram each point represents the end of the vector representing the output signal Ss, its amplitude (in dB) and its phase (in degrees) being indicated.

Figure 7:
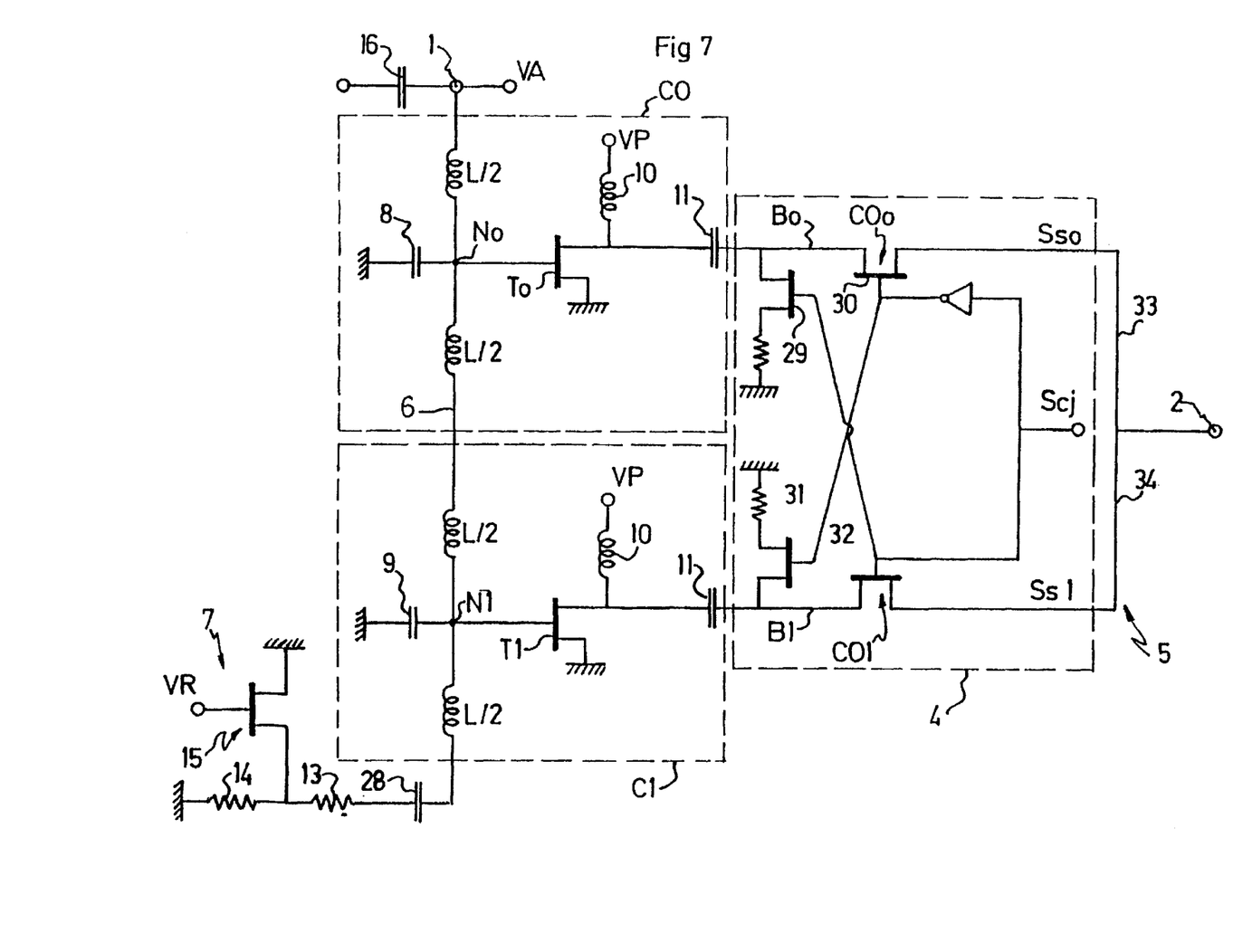
FIG. 7 is a schematic view of an embodiment of a circuit according to the invention, where m=n=2 and p=1.

FIG. 7 illustrates a second embodiment where the circuit according to the invention is a BPSK type with two phase states containing two phase-shift cells C0, C1 defining two branches B0, B1, so that m=n=2.

This embodiment provides additional capacitors 8, 9 connected between tapping point N0, N1 and ground. The distribution line 6 comprises series inductances L/2, an input capacitor 16, a terminating capacitor 28, resistors 13, 14 and the transistor 15 configured as a variable resistance to form the terminating device 7, two field-effect transistors T0, T1 with their bias inductance 10 and bias capacitor 11.

In this embodiment, the switching/modulating stage 4 contains two switching circuits CO0 and CO1 each comprised of two unbiased field-effect transistors 29, 30, 31, 32, of which the first 29, 31 is connected in parallel with its source connected to ground via a series resistor and its drain connected to the branch B0, B1, and the second 30, 32 connected in series with the source connected to the drain of the first transistor 29, 31, and whose drain supplies the branched output signal Ss0, Ss1. The gates of the transistors 29, 30, 31, 32 receive the two-state voltages U, $\overline{U}$ formed from the control signal SCj, which can itself assume two complementary states U, $\overline{U}$, so that when SCj=SC1=U, the signal Ss0 on the first branch is not zero and is equal to the signal coming from the phase-shift cell C0, while the signal Ss1 on the second branch is zero (the transistors 30 and 31 being conducting while the transistors 29 and 32 are turned off). And vice versa, when SCj=SC2=$\overline{U}$, the transistors 30, 31 are turned off while the transistors 29, 32 are conducting, so that the signal Ss0 is zero and the signal Ss1 is the signal emerging from the phase-shift cell C1.

Said means 5 for summing in phase the branched output signals Ss0, Ssl are simply formed from two lines 33, 34 of the same length and are star-connected downstream of the two outputs of the switching circuits CO0 and CO1 formed by the transistors 29, 30, 31, 32. The two lines 33, 34 are joined together at an output point forming the output 2 of the circuit, which therefore receives alternatively either the signal Ss0 or the signal Ss1, depending on the state of the control signal SCj.

The inductances L, the capacitance of the capacitors 8, 9, the transistors T0, T1 of the phase-shift cells C0, C1 and the adjusting voltage VA can be chosen so that Ss1 is phase-shifted by any value, even different from 180°, with respect to Ss0. A BPSK circuit with any value of phase shift is therefore obtained.

For example, the phase shift can be made a value other than 180° to obtain a bi-phase modulator with residual carrier for long-distance links having very low bit rates for planetary probes.

The invention is particularly advantageous for the production of microwave circuits (MMIC). It is, nevertheless, also applicable for phase shift modulation in other frequency ranges.

Furthermore, the invention is also applicable for the production of m-PSK circuits with distributed structure, which differ from those represented and described above, in particular with other values of m, n and p.

Moreover, it should be noted that the detailed electronic components and functions of the circuit which are not important within the context of this invention, and which could easily be selected and determined by the expert, are not all represented or described, so that the circuits described and represented certainly do not have to be considered as completely exhaustive with regard to the composition of the chips obtained in practice.

What is claimed is:

1. An electronic phase-shift keying modulator circuit comprising an input (1) intended to receive a sinusoidal input signal Se of angular frequency ωe and an output (2) delivering a sinusoidal output signal Ss phase shifted with respect to the input signal by a value φj which can vary among m values, φ1, . . . , φj, . . . , φm, m being an integer greater than or equal to 2, in accordance with a control signal SCj, the output signal Ss having an angular frequency ωs that is independent of the control signal Scj, wherein said circuit comprises:

a distribution line (6) extending from the input and including n cells Co, . . . , Ci, . . . , Cn−1, of similar phase shift, n being a whole number greater than or equal to 2, the n phase-shift cells being mounted along the distribution line (6) with each phase-shift cell Ci of rank i along the distribution line (6) comprising:

an input, referred to as the series input ISi, receiving the signal coming from the input of the circuit, either directly where i=0, or via (i−1) preceding phase-shift cells of rank less than i, interposed between the input (1) of the circuit and this phase-shift cell Ci, a first output, referred to as the series output OSi, delivering the signal on the distribution line to a subsequent phase-shift cell Ci+1 of higher rank i+1, or, where i=n−1, to a terminating device (7) of the distribution line (6), a tapping point Ni of the distribution line (6), a second output, referred to as the branched output ODi, connected to the tapping point Ni via a transistor Ti whose first terminal is connected to the tapping point Ni, whose second terminal is connected to ground, and whose third terminal supplies said branched output ODi of the phase-shift cell Ci, each phase-shift cell Ci being designed to deliver at its branched output ODi a signal SDi that is phase shifted with respect to the input signal Se, by the sum $\phi(Ci)$ of the phase shifts successively applied to the input signal Se, from the input (1) of the circuit by the phase-shift cells interposed between the input (1) of the circuit and said branched output ODi, connected to said branched output ODi of each phase-shift cell Ci, a switching/modulating circuit controlled by the control signal SCj, this switching/modulating circuit being:

when n=m, a switching circuit (CO0, CO1) delivering either a zero signal, or the signal SDi received from the cell Ci, in accordance with the control signal SCj, when n≠m, a modulating circuit Mo, . . . , Mi, . . . , Mn−1 with p phase states, p being a whole number less than m chosen so that $m \leq p^n$, designed to phase-shift the signal SDi received from the phase-shift cell Ci by a value $\phi k$, k being a whole number varying between 1 and p, in accordance with the control signal SCj, means (5) for summing in phase the signals Ssi coming from n switching/modulating circuits and to deliver at said output (2) of the circuit the result of this sum which forms the output signal Ss.

2. The circuit as claimed in claim 1, wherein each transistor Ti of the phase-shift cells is a field-effect transistor, and wherein said circuit comprises means (10, 11) for biasing the field-effect transistors of the phase-shift cells.

3. The circuit as claimed in claim 1, wherein each transistor Ti of the phase-shift cells is a field-effect transistor whose:

first terminal is the gate, second terminal is the source, third terminal is the drain, and wherein said circuit comprises means (12) for applying a DC voltage whose value is adjustable at the tapping point Ni, so as to form an adjustable capacitance between the tapping point Ni and ground.

4. The circuit as claimed in claim 1, wherein all the phase-shift cells are functionally identical and generate the same phase shift $\Delta\phi$ along the distribution line (6), the cell Ci delivering at its branched output a branched signal SDi that is phase-shifted with respect to the input signal Se by $\phi(Ci)=i \times \Delta\phi + \psi$, where $\psi$ is a constant.

5. The circuit as claimed in claim 4, wherein $\Delta\phi=2\pi/m$.

6. The circuit as claimed in claim 1, wherein said means (5) for summing in phase comprise star-connection lines (33, 34), all of which have the same length, from the outputs of n switching/modulating circuits at a common output point.

7. The circuit as claimed in claim 1, wherein said means (5) for summing in phase comprise a phase combiner circuit formed by a Wilkinson coupler tree (25, 26, 27) the final apex of which forms said output (2) of the circuit.

8. The circuit as claimed in claim 1, wherein when m is a multiple of a power of 2, n is equal to a power of 2.

9. The circuit as claimed in claim 1, wherein m is greater than or equal to 4, p is equal to 1, 2 or 4.

10. The circuit as claimed in claim 1, wherein m is greater than or equal to 8, n is greater than or equal to 4.

11. The circuit as claimed in claim 1, wherein the switching/modulating circuits are similar and consist exclusively of passive components.

12. The circuit as claimed in claim 1, wherein p=2 and wherein the switching/modulation circuits are binary phase-shift keying BPSK/modulator circuits with passive components, each formed by a high-pass filter (18) and a low-pass filter (17) connected in parallel and whose outputs are switched by a non-biased field-effect transistor array (21, 22) with their gate receiving a control signal having two complementary states.

13. The circuit as claimed in claim 3, wherein each phase-shift cell Ci is of a series inductance and parallel capacitance type, wherein said transistor Ti of each phase-shift cell Ci is a biased field-effect transistor whose gate is connected to the tapping point Ni on the distribution line (6) in parallel with the inductance, whose source is connected to ground, and whose drain supplies the branched signal SDi to said branched output ODi, and wherein said parallel capacitance is at least partially made up of the capacitance formed between the gate and the source of said biased field-effect transistor Ti.

14. The circuit as claimed in claim 13, wherein the means (12) for applying and adjusting a DC voltage of an adjustable value to each tapping point Ni include a terminal (12) of the distribution line (6) intended to receive a DC voltage VA so that the phase shifts of the signal at each tapping point Ni of the phase-shift cells Ci can be adjusted simultaneously, in particular in accordance with the angular frequency $\omega e$, by setting this one variable DC voltage VA.

15. The circuit as claimed in claim 14, wherein it comprises means (13, 14, 15) forming a variable impedance at one end terminal of the distribution line (6) opposite to the input (4) of the circuit, to allow its impedance matching.

16. The circuit as claimed in claim 15, wherein the variable impedance comprises a field-effect transistor (15) configured as a variable resistance, and whose gate receives a DC control voltage VR.

17. The circuit as claimed in claim 1, wherein the frequency of the input signal is greater than 1 Gigahertz and said circuit is formed from a monolithic integrated circuit.

* * * * *